United States Patent [19]
Chuang

[11] Patent Number: 6,093,609
[45] Date of Patent: Jul. 25, 2000

[54] METHOD FOR FORMING SEMICONDUCTOR DEVICE WITH COMMON GATE, SOURCE AND WELL

[75] Inventor: Andy Chuang, Hsinchu, Taiwan

[73] Assignee: United Microelectronics Corp., Taiwan

[21] Appl. No.: 09/193,975

[22] Filed: Nov. 18, 1998

[51] Int. Cl.[7] .................................................. H01L 21/336
[52] U.S. Cl. .......................... 438/286; 438/596; 438/682; 438/592; 438/303
[58] Field of Search ..................... 438/299, 286, 438/279, 301, 303, 305, 306, 545, 583, 586, 592, 595, 199, 213, 230, 596, 682, 304

[56] References Cited

U.S. PATENT DOCUMENTS

| | | | |
|---|---|---|---|
| 5,073,513 | 12/1991 | Lee | 438/267 |
| 5,219,793 | 6/1993 | Cooper et al. | 438/624 |
| 5,681,768 | 10/1997 | Smayling et al. | 438/301 |
| 5,895,269 | 4/1999 | Wang et al. | 438/675 |
| 5,985,707 | 11/1999 | Gil | 438/200 |

*Primary Examiner*—Charles Bowers
*Assistant Examiner*—Jack Chen
*Attorney, Agent, or Firm*—Blakely Sokoloff Taylor & Zafman

[57] ABSTRACT

A method has a feature that one side of the spacers surrounding a gate of a MOS transistor is removed and another side of the spacers is exposed. By the method of this invention, the gate, the source and the pick-up region of a well are electrically connected by a plug through a silicide layer covering them. Furthermore, the pick-up region is adjacent to the source such that the effective surface area can be reduced and the process has a higher error tolerance.

22 Claims, 4 Drawing Sheets

METHOD FOR FORMING SEMICONDUCTOR DEVICE WITH COMMON GATE, SOURCE AND WELL

BACKGROUND OF THE INVENTION

1. Field of the Invention

This invention relates in general to a manufacturing process for semiconductor devices, and more specifically relates to a manufacturing process for semiconductor devices having common gate, source and well structures.

2. Description of Related Art

FIGS. 1A through 1C schematically illustrate cross-sectional views of manufacturing process for forming a conventional semiconductor device having a common gate, source and well.

Referring to FIG. 1A, a well 102 and isolation regions 104 are formed within a substrate 100 by which structures the active region of the device is defined. A gate oxide 106 and a gate 108 are subsequently formed above the active region.

As shown in FIG. 1B, a P$^-$ lightly doped region 110 serving as a pocket region and an N$^-$ lightly doped region 112 serving as the lightly doped drain (LDD) of the device thereafter are subsequently formed within the well 102. The depth of the pocket region 110 is deeper than that of the LDD region 112. A spacer 114 is formed surrounding the gate 108 by which the source/drain region can be defined thereafter. N-type ions of higher concentration than in doped regions 110 and 112 are implanted into the doped region 110 and 112 to form N$^+$ doped regions 116a and 116b serving as the drain and the source, respectively. A P$^+$ doped region 118 is formed within the well 102 as shown in FIG. 1B, serving as the well pick-up region 118 of the well 102. Silicide layers 120a, 120b, 120c and 120d are deposited on the surfaces of the drain 116a, the source 116b, the gate 108 and the well pick-up region 118, respectively.

FIG. 1C schematically depicts the final structure of the device. A dielectric layer 122 is deposited on the whole surface of the substrate 100 and then contacts are formed within the dielectric layer 122, through which contacts the gate, source and well pick-up region are exposed. Afterwards, tungsten plugs 124a, 124b and 124c are formed within the contacts and then a metal layer is deposited on the dielectric layer 122 to serve as an interconnect to electrically connect the gate 108, source 116b and well pick-up region 118.

As seen in the foregoing description, the conventional method for forming semiconductor device having common gate, source and well uses three plugs 124a, 124b and 124c to connect the gate 108, source 116b and well 102 respectively, which 3 plugs increase the size of the device. Furthermore, in order not to increase the area of the device due to using the three plugs 124a, 124b and 124c to connect the gate 108, source 116b and well pick-up region 118, each area of the gate 108, source 116b and well pick-up region 118 has to be as small as possible, which reduces the alignment error tolerance. Therefore, the difficulty of forming a common gate, source and well in the conventional method is increased as well and affects the yield.

SUMMARY OF THE INVENTION

According to the foregoing description, an object of this invention is to provide a semiconductor structure having a common gate, source and well, which has higher alignment error tolerance.

Another object of this invention is to provide a manufacturing process corresponding to the structure of this invention, which simplifies the process and decreases the cost.

In accordance with the foregoing and other objectives, a method of a semiconductor device having a common gate, source and well is provided. As in all typical MOS transistor devices, there is at least a source/drain region of a MOS device formed in a well within a substrate. A well pick-up which has the same ion dopant as the well is adjacent to the source of the device. The gate of the device is formed on the substrate and is surrounded by a spacer.

A feature of the structure of this invention is that only a half-side spacer near the source side surrounding the gate is removed, which the silicide layer is able to smoothly cover over the top and the exposed sidewall of the gate, the source and the well pick-up region. A dielectric layer is formed on the whole surface of the device and a plug within the dielectric layer is connected to the silicide layer for electrically connecting the gate, source and well of the device. Meanwhile, the method for forming the structure mentioned above is also provided.

There is only one plug and a silicide layer connecting the gate, source and well, and the alignment error tolerance is higher. Furthermore, only one plug is used to connect the gate, source and well and the well pick-up region is adjacent to the source, so that the size of the device is therefore decreased and the cost is reduced.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

DESCRIPTION OF THE PREFERRED EMBODIMENT

Figure 1A:
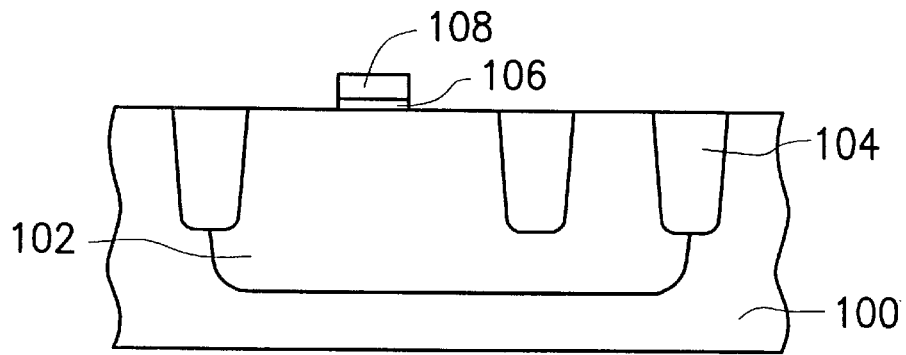
FIGS. 1A through 1C schematically illustrate cross-sectional views of the conventional manufacturing process for forming a semiconductor device having a common gate, source and well.
Figure 1B:
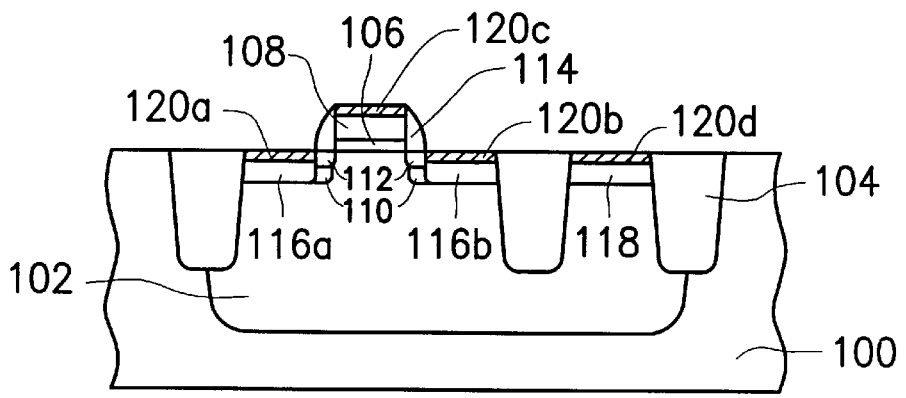
Figure 1C:
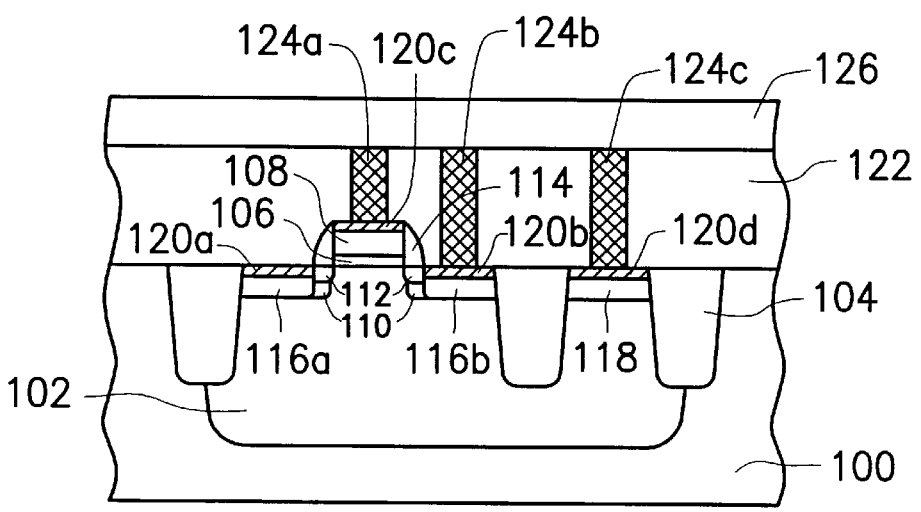

This invention discloses a structure and the corresponding manufacturing method of a semiconductor device with common gate, source and well. FIGS. 2A through 2I schematically illustrate the manufacturing process and FIG. 2I shows the structure of this invention.

FIG. 2I shows a schematic, cross-sectional view of the structure of the semiconductor device according to the preferred embodiment of this invention. A semiconductor substrate 200 has isolation regions 202 used to isolate each active region within the substrate 200, a P-well 204, and N$^+$-regions 218a, 218b respectively serving as the drain and source of a transistor. The material of the isolating regions 202 is silicon oxide (SiO$_2$) or other similar materials, and the isolating regions 202 can be shallow trench isolation (STI) or field oxide (FOX) structures. An N$^-$ ion lightly doped region 212 is beside the source/drain regions 218b/218a and serves as an N-type lightly doped drain (NLDD). Another P$^-$ ion lightly doped region 210 is beside the source/drain regions 218b/218a and under the NLDD 212 and serves as a P-type lightly doped drain (PLDD), which is a selective structure. A P$^+$ doped region 214 adjacent to the source 218b serves as the well pick-up region 214 of the P-well 204, by which a latch-up effect is prevented.

A feature of the structure of this invention features is that only a half-side spacer 216a near the drain 218a surrounding the gate 208 is reserved to form a one-sided spacer structure, which the silicide layer 220 is able to smoothly cover over the top and the exposed sidewall of the gate 208, the source 218b and the well pick-up region 214 of the P-well 204. A dielectric layer 224 is formed on the whole surface of the device and a plug 228 within the dielectric layer 224 electrically connects the silicide layer 220 with the gate 208, source 218b and well 204 of the device. A conducting layer 230, which can be a metal layer, is formed on dielectric layer 224 and serves as the interconnect. It should noted that the P-type ion doped regions can be replace by N-type ion doped regions, that is, the structure of this invention applies both to PMOS and NMOS device.

There is only one plug and a silicide layer to connect the gate, source and well of the structure mentioned above, the error tolerance of alignment is higher.

A manufacturing process corresponding to the structure of the semiconductor device mentioned above is described thereafter.

Referring to FIGS. 2A through 2I, a manufacturing process according to the preferred embodiment of this invention is illustrated.

Figure 2A:
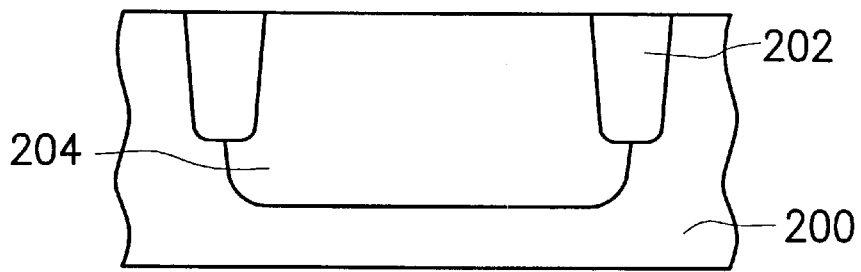
FIGS. 2A through 2I schematically illustrates the cross-sectional views of manufacturing process for forming a semiconductor device having a common gate, source and well according to the invention.
Figure 2B:
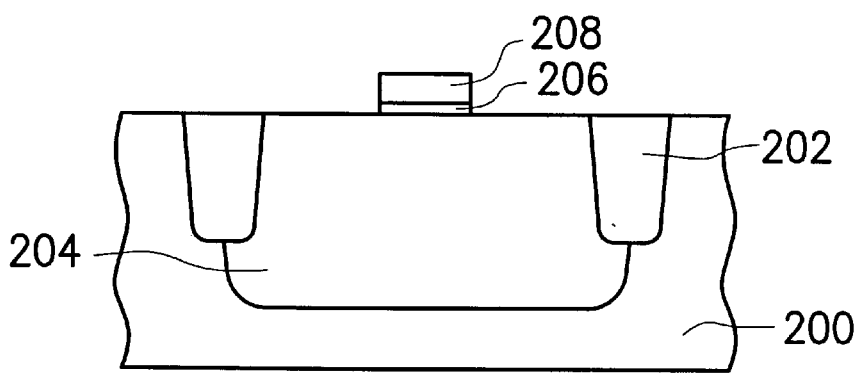

As shown in FIG. 2A, isolation region 202 and first-type well 204 are formed within a semiconductor substrate 200. The first-type well may be doped with P-type ions, which forms a P-well 204.

An active region is formed between the isolation regions 202. A gate oxide 206, whose material is silicon oxide ($SiO_2$), for example, and a gate 208, whose material is polysilicon, for example, are formed above the active region within the substrate 200.

Figure 2C:
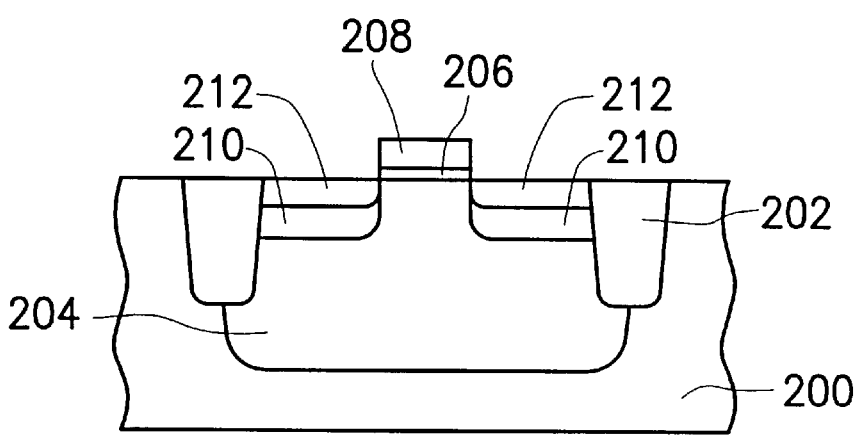

Referring to FIG. 2C, a first doped region 210 and a second doped region 212 are formed by ion implantation or other methods, in which the depth of the first doped region 210 is deeper than that of the second doped region 212. The first doped region 210 is a $P^-$ doped region and the second doped region 212 is $N^-$ doped region, which serve as the PLDD region 210 and NLDD 212, respectively, where LDD means lightly doped drain. It should be noticed that the formation of the PLDD 210 mentioned above is an optional process.

Figure 2D:
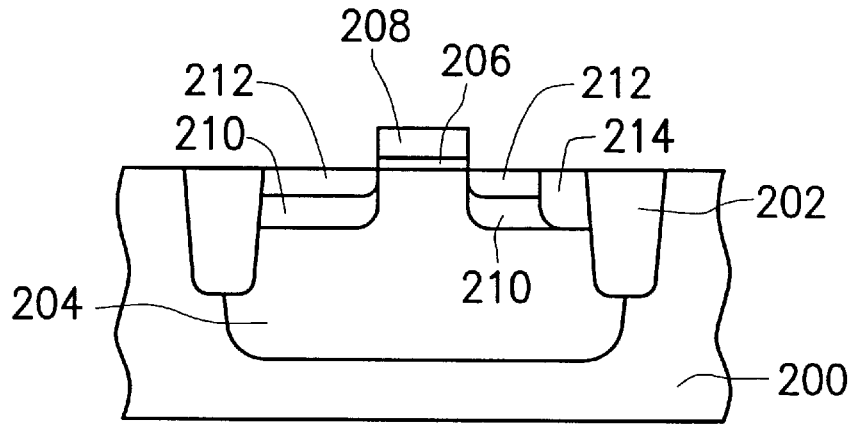

A doped region 214, implanted with $P^+$ ions at a depth deeper than that of the $N^-$ doped region 212, is formed adjacent to the isolation region 202 as shown in FIG. 2D. The $P^+$ doped region 214 formed here serves as a well pick-up region 214 of P-well 204 for electrical connection.

Figure 2E:
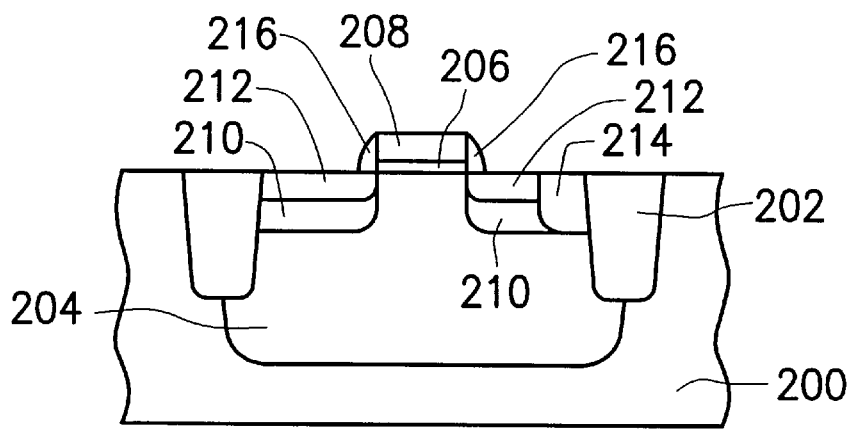
Figure 2F:
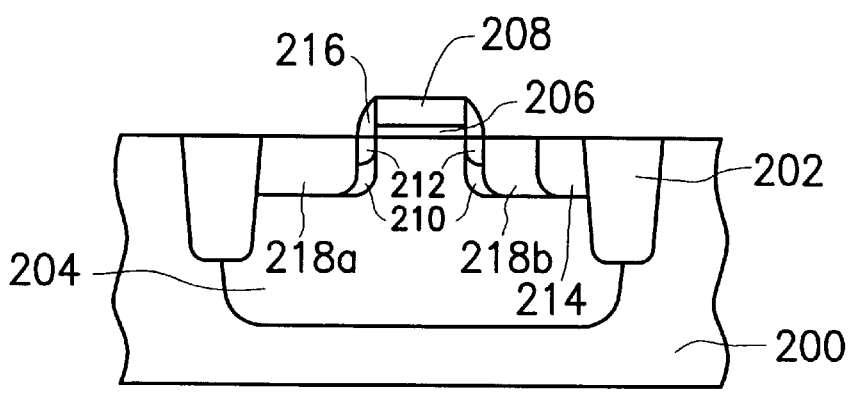

Referring to FIG. 2E, a spacer 216 is formed surrounding the polysilicon gate 206 of the semiconductor device. $N^+$ ions are driven into the doped regions 210 and 212, excepting the regions under the spacer 216 to form the drain and source regions 218a, 218b, respectively, of the semiconductor device, as shown in FIG. 2F.

Figure 2G:
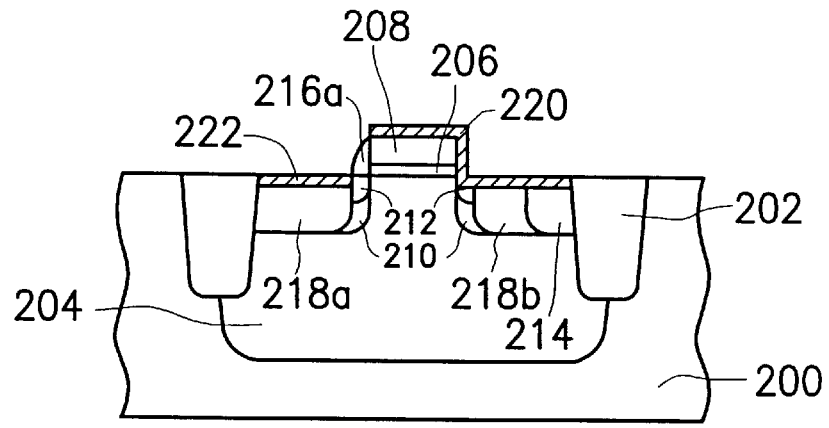
Figure 2H:
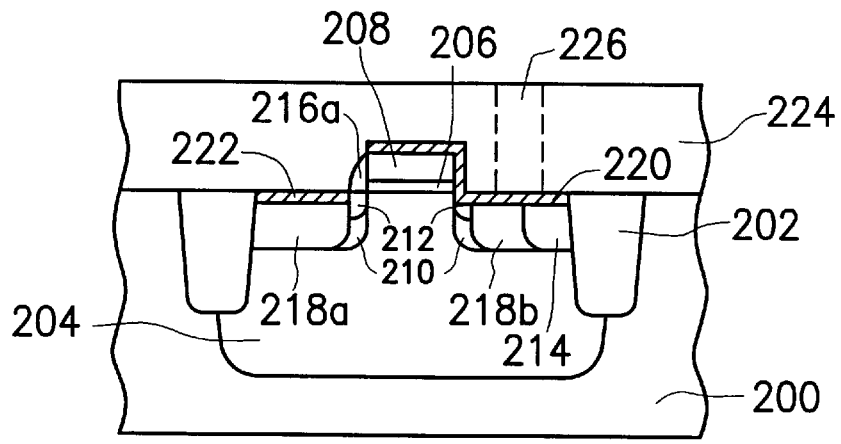
Figure 2I:
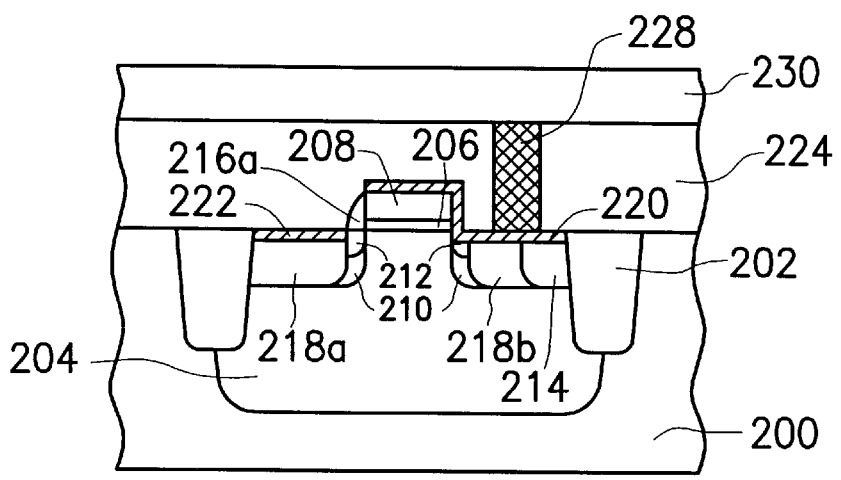

Referring to FIG. 2G, half of the spacer 216 surrounding the polysilicon gate 208 is removed to form a half-side spacer 216a which is near the drain side 218a and to expose the portion of the sidewall of the polysilicon gate 208 which is near the source side 218b. A silicide layer is formed by chemical vapor deposition and divided into two parts due to the half-side spacer 216a, wherein the first silicide layer 220 is formed on the top and the sidewall of the gate 208 and on the source region 218b and the pick-up region 214 and the second silicide layer 222 are formed on the drain region 218a. Therefore, the gate 208, the source region 218b and the pick-up region 214 of the P-well can be electrically connected through the first silicide layer 220 by a metal plug.

As seen in the foregoing description, the source region 218b and the pick-up region 214 of the P-well 204 are formed adjacently which can prevent a latch-up effect from occurring. In addition, the electrical connection between the source region 218b and the pick-up region 214 of the P-well 204 is achieved by the silicide layer 220. This allows the size of the pick-up 214 of the P-well 204 to be smaller than the opening of a contact and the effective surface from the gate 208 to the pick-up region 214 to be significantly reduced such that the device can be downsized.

A dielectric layer 224 is deposited on the surface of the substrate 200 and a contact 226 is formed within the dielectric layer 224 and above source region 218b and the pick-up region 214, such that the first silicide layer 220 is exposed by the contact 226. It should be noted that the contact 226 can be formed at any position, as long as only the first silicide layer 220 is exposed by the contact 226.

A metal plug 228, such as a tungsten plug, is formed within the contact 226, by which the gate 208, the source region 218b and the pick-up region 214 are electrically connected. A metal layer blanketed over the whole surface of the dielectric layer 224 serves as the interconnect of the device. The device having a common gate, source and well is completed.

Although the manufacturing process described above is an example of an NMOS device, the method of this invention can apply to a PMOS device having the same structure, just by replacing the P-type ions by the N-type ions in the proper region.

The major feature of this invention is the structure of the half-side spacer.

Another feature of this invention is that the source region and the pick-up region of well are formed adjacently, which can prevent a latch-up from occurring.

Still another feature of this invention that the electrical connection of the gate, source and well is achieved by only one metal plug through a silicide layer. The size of the pick-up region can be smaller than the opening of the contact.

The final feature of this invention is that the effective surface area from the gate to the pick-up region can be reduced significantly such that the device can be downsized.

While the present invention has been described with a preferable embodiment, this description is not intended to limit our invention. Various modifications of the embodiment will be apparent to those skilled in the art. It is therefore contemplated that the appended claims will cover any such modifications or embodiments as fall within the true scope of the invention.

What claimed is:

1. A method for forming a semiconductor device with a common gate, source and well, which is applied to a MOS transistor with at least a source, a drain and a pick-up region within a well in a substrate, a gate formed on the substrate and a spacer formed surrounding the gate, the method comprising:

removing a portion of the spacer near the source to expose a sidewall of the gate;

forming a first silicide layer to cover a top and the sidewall of the gate, the source and the pick-up region, and a second silicide layer to cover the drain, whereby the gate, the source, and the pick-up region are coupled by the first silicide layer;

forming a dielectric layer on the substrate and forming a contact in the dielectric layer to expose the first silicide layer; and forming a metal plug within the contact.

2. The method of claim 1, wherein the drain and the source are $N^+$ ion doped regions and the well is a P ion doped region.

3. The method of claim 2, wherein the pick-up region is a $P^+$ ion doped region.

4. The method of claim 2, further comprising a step of forming a $N^-$ lightly doped drain region (NLDD) beside the source and the drain under the spacer within the well.

5. The method of claim 2, further comprising a step of forming a $P^-$ lightly doped drain region (PLDD) beside the source and the drain under the $N^-$ lightly doped drain region within the well.

6. The method of claim 1, wherein the drain and the source are $P^+$ ion doped regions and the well is an N ion doped region.

7. The method of claim 6, wherein the pick-up region is an $N^+$ ion doped region.

8. The method of claim 6, further comprising a step of forming an $N^-$ lightly doped drain region (NLDD) beside the source and the drain under the spacer within the well.

9. The method of claim 6, further comprising a step of forming a $P^-$ lightly doped drain region (PLDD) beside the source and the drain under the $N^-$ lightly doped drain region within the well.

10. The method of claim 1, wherein the first and the second silicide layer are formed by chemical vapor deposition.

11. The method of claim 1, wherein the metal plug is a tungsten plug.

12. A method for forming a semiconductor device with a common gate, source and well, wherein the method is applied to a MOS transistor which comprises at least a source, a drain within a well in a substrate, a gate formed on the substrate and a spacer formed surrounding the gate, the method comprising:

forming a pick-up region of the well adjacent to the source;

removing a portion of the spacer near the source to expose the sidewall of the gate;

forming a first silicide layer to cover a top and a sidewall of the gate, the source and the pick-up region, and a second silicide layer to cover the drain, whereby the gate, the source, and the pick-up region are coupled by the first silicide layer;

forming a dielectric layer on the substrate and forming a contact therein to expose the first silicide layer;

forming a metal plug within the contact; and forming a metal layer on the dielectric layer.

13. The method of claim 12, wherein the drain and the source are $N^+$ ion doped regions and the well is a P ion doped region.

14. The method of claim 13, wherein the pick-up region is a $P^+$ ion doped region.

15. The method of claim 13, further comprising a step of forming an $N^-$ lightly doped drain region (NLDD) beside the source and the drain under the spacer within the well.

16. The method of claim 13, further comprising a step of forming a $P^-$ lightly doped drain region (PLDD) beside the source and the drain under the $N^-$ lightly doped drain region within the well.

17. The method of claim 12, wherein the drain and the source are $P^+$ ion doped regions and the well is an N ion doped region.

18. The method of claim 17, wherein the pick-up region is an $N^+$ ion doped region.

19. The method of claim 17, further comprising a step of forming a $N^-$ lightly doped drain region (NLDD) beside the source and the drain under the spacer within the well.

20. The method of claim 17, further comprising a step of forming a $P^-$ lightly doped drain region (PLDD) beside the source and the drain under the $N^-$ lightly doped drain region within the well.

21. The method of claim 12, wherein the first and the second silicide layer are formed by chemical vapor deposition.

22. The method of claim 12, wherein the metal plug is a tungsten plug.

* * * * *